US012644182B2

(12) United States Patent
Chang et al.

(10) Patent No.:  US 12,644,182 B2
(45) Date of Patent:  Jun. 2, 2026

(54) GAS DISTRIBUTION APPARATUSES FOR IMPROVING MIXING UNIFORMITY

(71) Applicant: Applied Materials, Inc., Santa Clara, CA (US)

(72) Inventors: Youngki Chang, Santa Clara, CA (US); Dhritiman Subha Kashyap, Murugeshpalya (IN); Rakesh Ramadas, San Jose, CA (US); Ashutosh Agarwal, San Jose, CA (US); Shashidhara Patel H B, Bangalore (IN); Muhannad Mustafa, Milpitas, CA (US); Sanjeev Baluja, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 591 days.

(21) Appl. No.: 17/897,452

(22) Filed: Aug. 29, 2022

(65) Prior Publication Data

US 2024/0068095 A1       Feb. 29, 2024

(51) Int. Cl.
*C23C 16/455*       (2006.01)

(52) U.S. Cl.
CPC .. *C23C 16/45565* (2013.01); *C23C 16/45512* (2013.01); *C23C 16/45561* (2013.01); *C23C 16/45589* (2013.01)

(58) Field of Classification Search
CPC ........ C23C 16/45565; C23C 16/45512; C23C 16/45561; C23C 16/45589; C23C 16/45544

(Continued)

(56) References Cited

U.S. PATENT DOCUMENTS 6,036,783 A  *  3/2000  Fukunaga  ........... C23C 16/4557
                                                        392/394
6,450,117 B1 *  9/2002  Murugesh  ........ H01J 37/32862
                                                        134/1.1

(Continued)

FOREIGN PATENT DOCUMENTS

JP              02281729 A      11/1990
JP          2002252219 A        9/2002

(Continued)

OTHER PUBLICATIONS

PCT International Search Report and Written Opinion in PCT/US2023/031265 dated Nov. 21, 2023, 9 pages.

*Primary Examiner* — Rudy Zervigon
(74) *Attorney, Agent, or Firm* — SERVILLA WHITNEY LLC

(57)                     ABSTRACT

Gas distribution apparatuses described herein include a mixing plate adjacent a back plate of a showerhead. The mixing plate has a back surface and a front surface defining a thickness of the mixing plate. The mixing plate has a mixing channel comprising a top portion and a bottom portion defining a mixing channel length and at least two gas inlets in fluid communication with the top portion of the mixing channel. The gas distribution apparatus also includes a mixer disposed within the thickness of the mixing plate in the top portion of the mixing channel. The mixer has a top plate and a mixer stem extending from the top plate and a plurality of blades positioned along the mixer stem length. Also provided are processing chambers including the gas distribution apparatuses described herein.

19 Claims, 4 Drawing Sheets

(58) Field of Classification Search
USPC ............. 118/715; 156/345.33, 345.34, 45.34
See application file for complete search history.

(56) References Cited

U.S. PATENT DOCUMENTS

| 6,596,085 B1 * | 7/2003 | Schmitt ............... C23C 16/4486 118/726 |
| 6,786,973 B2 * | 9/2004 | Strauch ............. C23C 16/45568 222/3 |
| 6,872,258 B2 * | 3/2005 | Park .................. C23C 16/45589 156/345.33 |
| 7,183,227 B1 * | 2/2007 | Rasheed ............... C23C 16/045 438/758 |
| 7,204,885 B2 | 4/2007 | Derderian |
| 7,740,706 B2 * | 6/2010 | Park .................. H01J 37/32449 156/345.33 |
| 7,892,357 B2 * | 2/2011 | Srivastava ........ H01L 21/67115 156/345.1 |
| 9,057,388 B2 * | 6/2015 | Comeau .................. C23C 16/50 |
| 9,222,172 B2 * | 12/2015 | Rasheed .......... H01L 21/02271 |
| 9,951,421 B2 | 4/2018 | Lind |
| 10,358,722 B2 * | 7/2019 | Wiltse ............... C23C 16/45565 |
| 10,883,175 B2 * | 1/2021 | Wiegers ............. C23C 16/4412 |
| 11,077,410 B2 * | 8/2021 | Pandey ............ C23C 16/45563 |
| 11,101,136 B2 | 8/2021 | Yang et al. |
| 2002/0188376 A1 | 12/2002 | Derderian et al. |
| 2003/0084848 A1 * | 5/2003 | Long .................. H01J 37/3244 118/712 |
| 2003/0177977 A1 * | 9/2003 | Strauch ............. C23C 16/45508 118/715 |
| 2005/0000441 A1 * | 1/2005 | Kaeppeler ......... C23C 16/45568 118/723 E |
| 2006/0130756 A1 * | 6/2006 | Liang .................... C23C 16/507 118/715 |
| 2006/0196603 A1 * | 9/2006 | Lei ....................... H01J 37/3244 156/345.33 |
| 2006/0201426 A1 * | 9/2006 | Lee .......................... B05D 1/60 118/715 |
| 2008/0121177 A1 * | 5/2008 | Bang .................. C23C 16/4405 257/E21.24 |
| 2008/0124944 A1 * | 5/2008 | Park .................... C23C 16/4401 438/778 |
| 2008/0185104 A1 * | 8/2008 | Brcka ................. H01J 37/3244 422/187 |
| 2008/0274297 A1 | 11/2008 | Furuta et al. |
| 2009/0120364 A1 | 5/2009 | Suarez et al. |
| 2011/0265721 A1 | 11/2011 | Kao |
| 2011/0315320 A1 * | 12/2011 | Do .................... H01J 37/32091 118/723 MP |
| 2013/0084391 A1 * | 4/2013 | Lee ................... H01L 21/68764 239/290 |
| 2015/0167168 A1 * | 6/2015 | Keshavamurthy ............................ C23C 16/45591 438/758 |
| 2016/0032456 A1 | 2/2016 | Wongsenakhum et al. |
| 2016/0362785 A1 | 12/2016 | Kim et al. |
| 2017/0241015 A1 | 8/2017 | Sim et al. |
| 2020/0370180 A1 | 11/2020 | Agarwal et al. |
| 2021/0079522 A1 * | 3/2021 | Wu ........................ B01D 45/12 |

FOREIGN PATENT DOCUMENTS

| JP | 2017147447 A | 8/2017 |
| KR | 20170006178 A | 1/2017 |
| TW | 201200626 A | 1/2012 |
| TW | 202115278 A | 4/2021 |
| TW | 202231913 A | 8/2022 |

\* cited by examiner

GAS DISTRIBUTION APPARATUSES FOR IMPROVING MIXING UNIFORMITY

TECHNICAL FIELD

The present disclosure generally relates to an apparatus for flowing a gas into and out of a processing chamber. More specifically, embodiments of the disclosure are directed to apparatuses for introducing improved uniformly mixed gases into a processing chamber.

BACKGROUND

In the field of semiconductor processing, flat-panel display processing or other electronic device processing, vapor deposition processes have played an important role in depositing materials on substrates (also referred to as wafers). As the geometries of electronic devices continue to shrink and the density of devices continues to increase, the size and aspect ratio of the features are becoming more aggressive, e.g., feature sizes of about 0.07 µm and aspect ratios of 10 or greater.

During an atomic layer deposition (ALD) process, reactant gases are introduced into a process chamber containing a substrate. Generally, a region of a substrate is contacted with a first reactant which is adsorbed onto the substrate surface. The substrate is then contacted with a second reactant which reacts with the first reactant to form a deposited material. A purge gas may be introduced between the deliveries of each reactant gas to ensure that the only reactions that occur are on the substrate surface.

Some processes use multiple gases for various reasons. For example, a chemical vapor deposition (CVD) process may mix two reactive gases in the process region of a process chamber while adding a third gas as a diluent or catalytic agent. Additionally, some processes may incorporate additional gases post-processing to treat the deposited film or clean the process chamber.

When multiple gases are introduced into a processing chamber through a single-entry point (e.g., through a showerhead), gas mixing uniformity behind the entry point is important to ensure a unform gas at the substrate surface. In many showerheads configurations, gases entering through the showerhead are non-uniformly mixed so that deposition gases at the substrate surface that are non-uniform, resulting in non-uniformity of the deposition process.

Accordingly, there is a need in the art for apparatuses to introduce improved uniformly mixed gases into a processing chamber.

SUMMARY

One or more embodiments of the disclosure are directed to gas distribution apparatuses. The gas distribution apparatus comprises a mixing plate adjacent a back plate of a showerhead. The mixing plate has a back surface and a front surface defining a thickness of the mixing plate and a mixing channel comprising a top portion and a bottom portion defining a mixing channel length. The top portion has a first inner diameter and the bottom portion has a second inner diameter not equal to the first inner diameter. The mixing plate further includes at least two gas inlets in fluid communication with the top portion of the mixing channel. The gas distribution apparatus also includes a mixer disposed within the thickness of the mixing plate in the top portion of the mixing channel. The mixer has a top plate and a mixer stem extending from the top plate. The mixer stem comprises a top and a bottom defining a mixer stem length. The top of the mixer stem is connected to the top plate and extends into the top portion of the mixing channel. The mixer includes a plurality of blades positioned along the mixer stem length.

Additional embodiments of the disclosure are directed to a processing chamber. The processing chamber comprises a chamber body having a top wall, bottom wall and at least one sidewall defining a processing volume. The processing chamber also includes a mixing plate adjacent a back plate of a showerhead. The mixing plate has a back surface and a front surface defining a thickness of the mixing plate and a mixing channel comprising a top portion and a bottom portion defining a mixing channel length. The top portion has a first inner diameter and the bottom portion has a second inner diameter not equal to the first inner diameter. The mixing plate further includes at least two gas inlets in fluid communication with the top portion of the mixing channel. The processing chamber also includes a mixer disposed within the thickness of the mixing plate in the top portion of the mixing channel. The mixer has a top plate and a mixer stem extending from the top plate. The mixer stem comprises a top and a bottom defining a mixer stem length. The top of the mixer stem is connected to the top plate and extends into the top portion of the mixing channel. The mixer includes a plurality of blades positioned along the mixer stem length. The processing chamber further includes a substrate support spaced a distance from a front plate of the showerhead.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1:
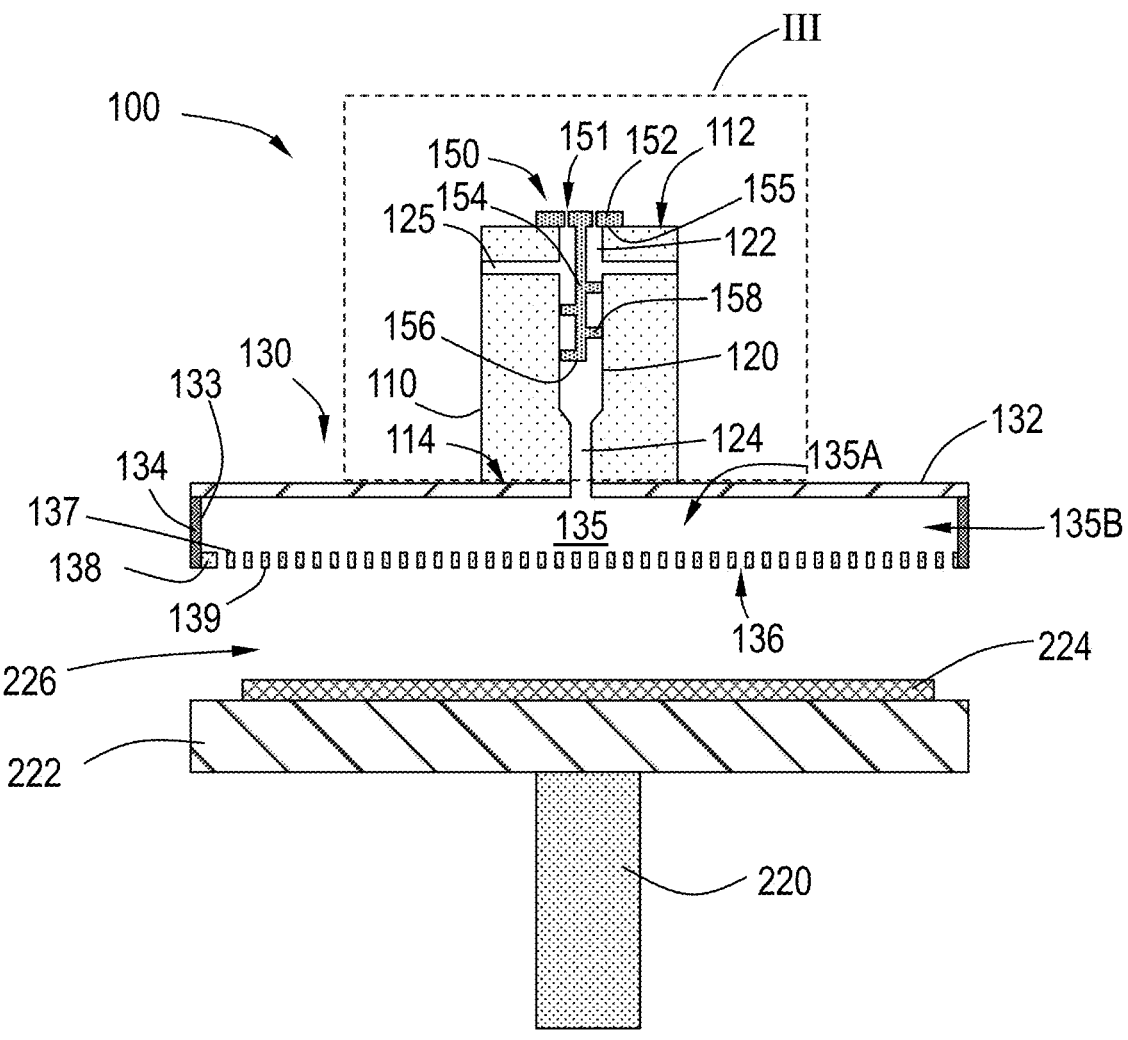
FIG. 1 illustrates a gas distribution apparatus in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

As used in this specification and the appended claims, the terms "precursor", "reactant", "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

Embodiments of the disclosure are directed to gas distribution apparatuses for use in chemical vapor deposition (CVD) type processes. One or more embodiments of the disclosure are directed to atomic layer deposition (ALD) processes and apparatuses incorporating the gas distribution apparatus described herein.

Embodiments of the disclosure provide gas inlet and mixers configured to provide improved mixing uniformity while keeping system pressure drop low. Some embodiments improve uniformity by describing inlet arrangement improvements. Some embodiments improve uniformity by providing a larger mixing volume.

In a conventional process, two gases with a carrier gas (e.g., argon) go into a mixer in the gas injector. However, the gases do not mix well resulting in high non-uniformity. For example, in a conventional injector assembly where there are three radial inlets arranged at equal intervals around the injector inlet, the non-uniformity is high (e.g., up to 40%). Embodiments of the disclosure provide injector inlet configurations that improve the non-uniformity of gas mixing before introducing the mixture to the process region above the substrate surface.

In one or more embodiments, feed gas carrying chemical species from a mixing channel in fluid communication with the center region of the gas volume and having a mixer disposed on the inside of the mixing channel to increase gas flow temperature comes to an upper plenum (or lower plenum in a different configuration). The gas flows through the mixing channel and mixer into a processing volume. The process gas interacts with the wafer surface leading to surface processing (deposition or etch). The process gas with by-products is removed through the outlet. In this manner, the mixer advantageously increases the temperature of the gas flow such that pre-heating of the gas is not required, leading to improved temperature uniformity in the processing chamber. The presence of the mixer in the mixing channel is effective at increasing the incoming gas flow, which is cost effective because an additional preheating system is not required. Additionally, the mixer does not affect the delivery time of the precursors.

Figure 2:
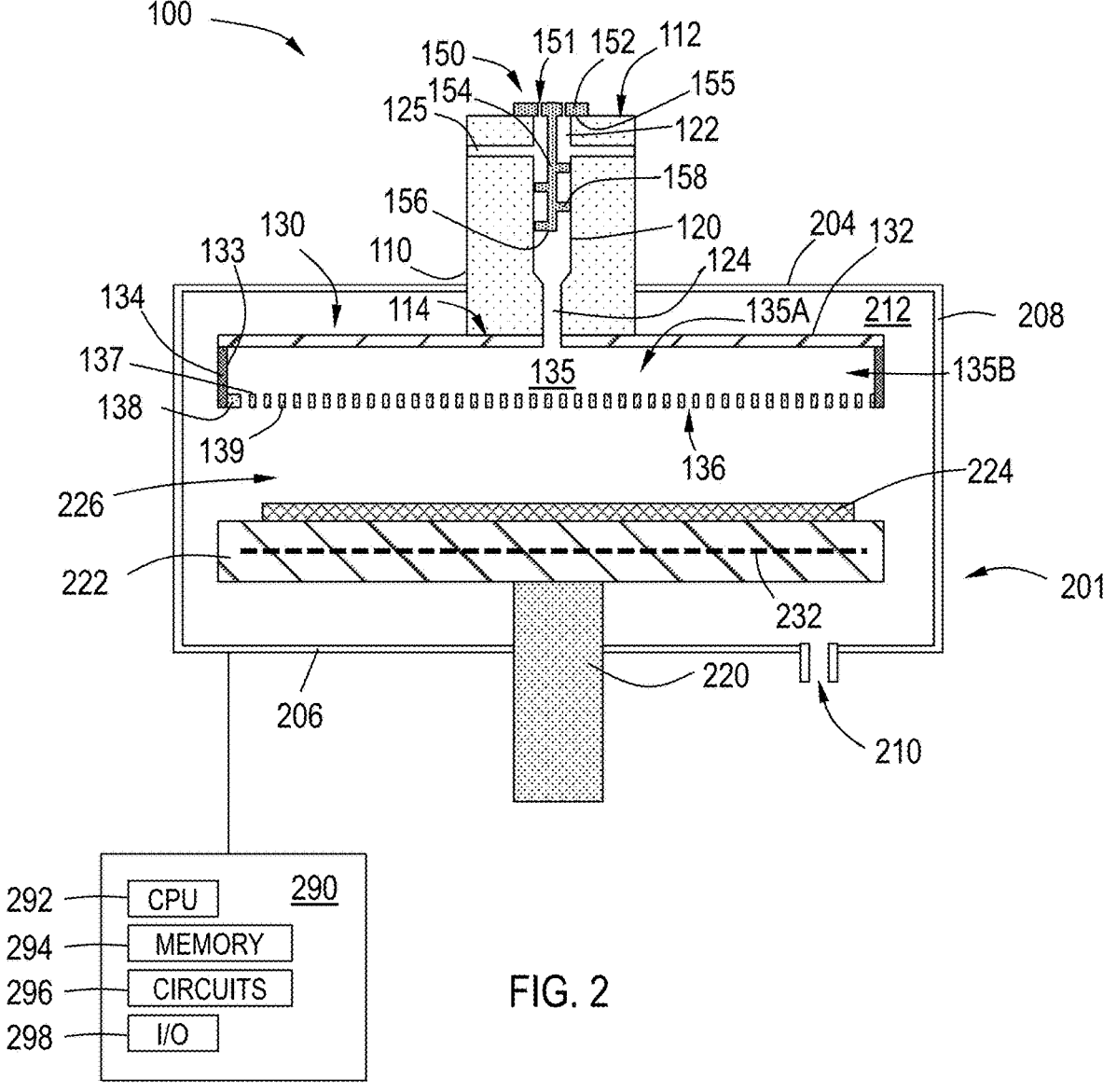
FIG. 2 illustrates a processing chamber including the gas distribution apparatus shown in FIG. 1.
Figure 3:
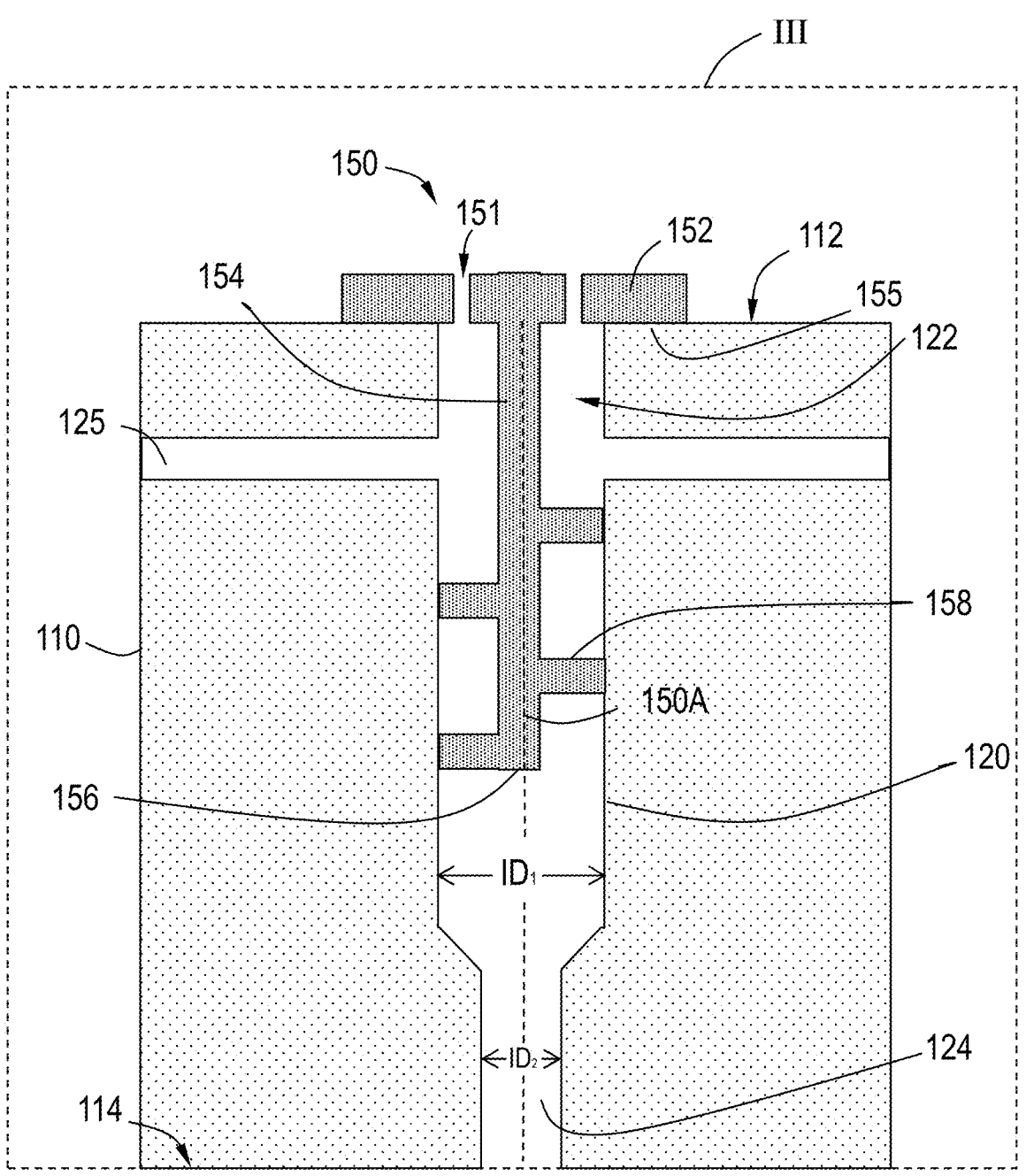
FIG. 3 illustrates an enlarged view of region III of the gas distribution apparatus shown in FIG. 1.
Figure 4:
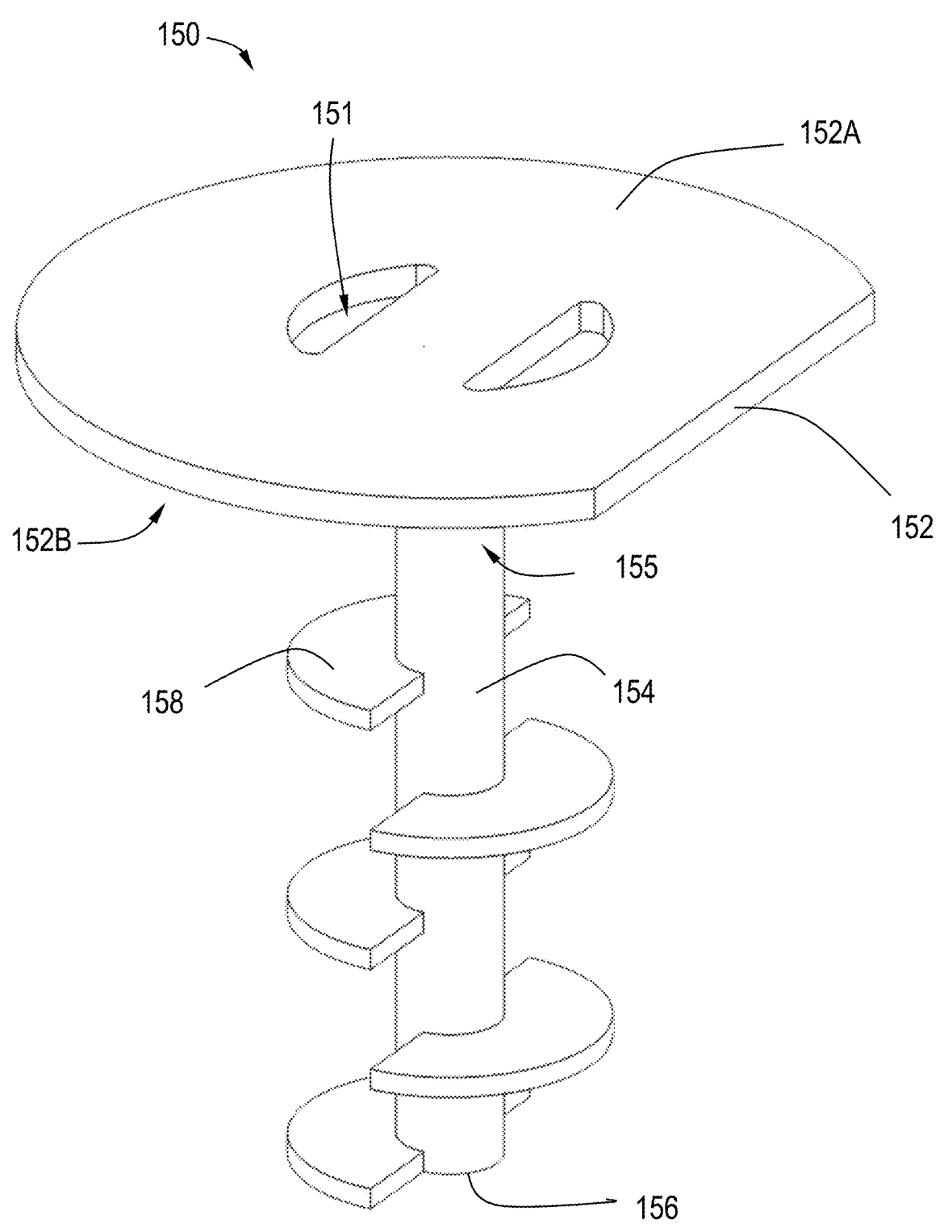
FIG. 4 illustrates a mixer in accordance with one or more embodiments of the disclosure.

Referring to FIGS. 1 and 2, one or more embodiments of the present disclosure are directed to a gas distribution apparatus 100 configured to provide improved mixing uniformity while keeping system pressure drop low. In some embodiments, the gas distribution apparatus 100 comprises a mixing plate 110 adjacent a back plate 132 of a showerhead 130. The mixing plate 110 has a back surface 112 and a front surface 114 defining a thickness of the mixing plate. The mixing plate 110 can have any suitable thickness. In some embodiments, the thickness of the mixing plate is in a range of from 60 mm to 85 mm, including in a range of from 60 mm to 80 mm, or in a range of from 70 mm to 80 mm.

The mixing plate 110 includes a mixing channel 120 comprising a top portion 122 and a bottom portion 124 defining a mixing channel length. The mixing channel length can be any suitable length. In some embodiments, the mixing channel length is in a range of from 200 mm to 350 mm, including in a range of from 225 mm to 325 mm, or in a range of from 250 mm to 300 mm.

The top portion 122 of the mixing channel 120 has a first inner diameter $ID_1$ and the bottom portion 124 of the mixing channel 120 has a second inner diameter $ID_2$ not equal to the first inner diameter $ID_1$. Embodiments of the disclosure advantageously improve uniformity by providing a larger mixing volume, such as when the first inner diameter $ID_1$ is greater than the second inner diameter $ID_2$. In some embodiments, the first inner diameter $ID_1$ is at least 1.5 times greater than the second inner diameter $ID_2$. In some embodiments, the first inner diameter $ID_1$ is 2 times greater than the second inner diameter $ID_2$. In one or more specific embodiments, the first inner diameter $ID_1$ is in a range of from 20 mm to 40 mm and the second inner diameter $ID_2$ is in a range of from 10 mm to 25 mm.

Embodiments of the disclosure provide injector inlet configurations that improve the non-uniformity of gas mixing before introducing the mixture to the process region above the substrate surface. In some embodiments, the mixing plate 110 includes at least two gas inlets 125 in fluid communication with the top portion 122 of the mixing channel 120. In some embodiments, each of the at least two gas inlets 125 is configured to flow a different gas.

In some embodiments, there are two gas inlets 125 arranged at equally spaced angles relative to a central axis 150A of the mixing channel 120. In some embodiments, there are two gas inlets 125 disposed on the same side of the mixing channel 120 relative to the central axis 150A of the mixing channel 120. In some embodiments, there are two gas inlets 125 disposed on the same side of the mixing channel 120 relative to the central axis 150A, and the two gas inlets 125 disposed on the same side of the mixing channel 120 are also arranged at equally spaced angles relative to the central axis 150A of the mixing channel 120. In some embodiments, there are three gas inlets 125 arranged at equally spaced angles relative to the central axis 150A of the mixing channel 120 to create a swirling flow pattern.

In embodiments where the mixing plate 110 has two gas inlets 125, at least one of the two gas inlets 125 is radially aligned with the top portion 122 of the mixing channel 120. In other embodiments where the mixing plate 110 has two gas inlets 125, each of the two gas inlets 125 are radially aligned with the top portion 122 of the mixing channel 120. In some embodiments, there are three gas inlets 125 and each of the three gas inlets 125 include three inlets that are radially aligned with the top portion 122 of the mixing channel 120. Stated differently, in embodiments where there are three gas inlets 125 and each of the three gas inlets 125 include three inlets that are radially aligned with the top portion 122 of the mixing channel 120, there are 9 gas inlets 125 that are radially aligned with the top portion 122 of the mixing channel 120.

In embodiments where the mixing plate 110 has two gas inlets 125, at least one of the two gas inlets 125 is tangentially aligned with the top portion 122 of the mixing channel 120. In other embodiments where the mixing plate 110 has two gas inlets 125, each of the two gas inlets 125 are tangentially aligned with the top portion 122 of the mixing channel 120. In some embodiments, there are three gas inlets 125 and each of the three gas inlets 125 include three inlets that are tangentially aligned with the top portion 122 of the mixing channel 120. Stated differently, in embodiments where there are three gas inlets 125 and each of the three gas inlets 125 include three inlets that are tangentially aligned with the top portion 122 of the mixing channel 120, there are 9 gas inlets 125 that are tangentially aligned with the top portion 122 of the mixing channel 120.

The gas distribution apparatus further comprises a mixer 150 disposed within the thickness of the mixing plate 110 in the top portion 122 of the mixing channel 120. The mixer 150 has a top plate 152 and a mixer stem 154 extending from the top plate 152. The top plate 152 comprises a top surface 152A and a bottom surface 152B defining a thickness of the top plate 152. The top plate 152 may have any suitable thickness. In some embodiments, the thickness of the top plate 152 is in a range of from 4 mm to 10 mm, including in a range of from 5 mm to 9 mm, or in a range of from 6 mm to 8 mm.

In some embodiments, the top plate 152 of the mixer 150 comprises at least one top inlet 151 extending through the thickness of the top plate 152 into the mixing channel 120. In some embodiments, the at least one top inlet 151 is configured to flow a different gas than one of the at least two gas inlets 125. In some embodiments, the at least one top inlet 151 is configured to flow a different gas than each of the at least two gas inlets 125.

The mixer stem 154 comprises a top 155 and a bottom 156 defining a mixer stem length. The mixer stem 154 can be any suitable shape. The mixer stem length can be any suitable length. In some embodiments, the mixer stem length is in a range of from 60 mm to 150 mm, including in a range of from 70 mm to 140 mm, or in a range of from 80 mm to 130 mm, or in a range of from 90 mm to 120 mm.

In some embodiments, the top 155 of the mixer stem 154 is connected to the top plate 152 and extends into the top portion 122 of the mixing channel 120. In specific embodiments, the top 155 of the mixer stem 154 has a flat surface to provide a connection to a bottom surface of the top plate 152.

The mixer stem 154 is disposed on the inside of the mixing channel 120 to increase gas flow temperature. The mixer stem 154 may have any shape and/or size such that it fits within the inside of the mixing channel 120. The mixer stem 154 can be, for example, straight, round, square, oval, rectangular, or oblong. Additionally, the overall shape of the mixer stem 154 can be made up of repeating units, parallel, perpendicular, or concentric to each other. In one or more embodiments, the mixer stem 154 has an overall shape in which there is substantially no dead space to inhibit gas flow. As used in this specification and the appended claims, the term "substantially no dead space" means that the flow of gas is inhibited by less than about 10%, by less than about 5%, or by less than about 1% due to dead space.

In some embodiments, the mixer stem 154 is located at the entrance of the top portion 122 of the mixing channel 120. In some embodiments, the mixer stem 154 is entirely located within the top portion 122 of the mixing channel 120. In some embodiments, the top 155 of the mixer stem 154 is connected to the top plate 152 and extends into the top portion 122 of the mixing channel 120 and the bottom 156 of the mixer stem 154 extends into the top portion 122 of the mixing channel 120. In other embodiments, the top 155 of the mixer stem 154 is connected to the top plate 152 and extends into the top portion 122 of the mixing channel 120 and the bottom 156 of the mixer stem 154 extends into the bottom portion 124 of the mixing channel 120.

In some embodiments, the mixer 150 includes a plurality of blades 158 positioned along the mixer stem length. The mixer 150 can have any suitable number of blades 158 along the mixer stem length. The blades 158 of some embodiments occupy in the range of 90° to 270° of a circle and are positioned at differing z-locations along the mixer stem length. In some embodiments, one or more of the plurality of blades 158 is oriented at an angle of 180° in a z-direction relative to the mixer stem length. In some embodiments, there is in a range of from 2 to 8 blades 158 arranged at equally spaced distances along the mixer stem length. In one or more specific embodiments, there is in a range of from 3 to 6 blades 158 arranged at equally spaced distances along the mixer stem length. In some embodiments, there are 4 blades 158 arranged at equally spaced distances along the mixer stem length.

In some embodiments, a front plate 138 and the back plate 132 of the showerhead 130 are spaced to form a gas volume 135. In some embodiments, the front plate 138 of the showerhead 130 has an inner surface 137 adjacent the gas volume and an outer surface 139 with a plurality of apertures 136 extending therethrough. In some embodiments, the gas volume has a center region 135A and an outer region 135B defining a length of the gas volume 135. In one or more embodiments, the mixing channel 120 is in fluid communication with the center region 135A of the gas volume 135.

In one or more embodiments, the back plate 132 of the showerhead 130 is angled toward the front plate 138 at the outer region 135B of the gas volume 135 to form a funnel shape. For example, in some embodiments, the back plate 132 of the showerhead 130 is tapered toward the front plate 138 at the outer region 135B of the gas volume 135 such that the showerhead 130 is in the shape of a cone or funnel. In such embodiments, the front plate 138 has a width greater than the width of the back plate 132.

In one or more embodiments, the showerhead 130 is funnel shaped, and the mixing channel 120 creates a vortex spiraling outward from the center region 135A to the outer region 135B of the gas volume 135. In some embodiment, the vortex flow helps to mix the gases within the gas volume 135.

In some embodiments, the showerhead 130 further comprises at least one sidewall 134 connecting the front plate 138 to the back plate 132 and defining an outer peripheral edge 133 of the outer region 135B of the gas volume 135. In some embodiments, the at least one sidewall 134 is an insulator to electrically separate the front plate 138 from the back plate 132. The insulator may be any insulator known to one of skill in the art.

In other embodiments, not illustrated, the showerhead 130 does not comprise at least one sidewall 134, such that the front plate 138 is directly connected to the back plate 132, defining the gas volume 135.

In one or more embodiments, the gas distribution apparatus 100 comprises a substrate support 222 or pedestal spaced a distance from the front plate 138 of the showerhead 130. In some embodiments, the substrate support 222 comprises a heater (not illustrated). In some embodiments, the substrate support 222 holds a substrate 224. The temperature of the substrate 224 and the substrate processing region 226 may be controlled in part by the substrate support 222. The substrate support 222 may be thermally coupled to a cooling/heating unit (not illustrated) that adjusts the substrate support 222 and substrate 224 temperature to, for example, about −100° C. to about 100° C.

In some embodiments, one of the front plate 138 and the back plate 132 is connected to an RF power source (not illustrated) and the other of the front plate 138 and the back plate 132 is connected to electrical ground to generate a plasma within the gas volume 135. A plasma may be ignited either in the gas volume 135 or in the substrate processing region 226 below showerhead 130. In one or more embodiments, a plasma may be present in the gas volume 135 to produce a precursor from an inflow of a process gas that has traveled through the mixing channel 120 comprising the mixer 150. An AC voltage typically in the radio frequency (RF) range is applied between the back plate 132 and the front plate 138 of the showerhead 130 to ignite a plasma in the gas volume 135 during deposition. An RF power supply generates a high RF frequency of 13.56 MHz but may also generate other frequencies alone or in combination with the 13.56 MHz frequency.

In some embodiments, RF energy supplied by the RF power source may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

Additional embodiments of the present disclosure are directed to a processing chamber 200 including a gas distribution apparatus 100 configured to provide improved mixing uniformity while keeping system pressure drop low. In some embodiments, the processing chamber 200 comprises a chemical vapor deposition (CVD) apparatus. Referring to FIG. 2, the processing chamber 200 comprises a chamber body 201 having a top wall 204, bottom wall 206 and at least one sidewall 208 defining a processing volume 212. In some embodiments, the processing chamber 200 further comprises the gas distribution apparatus 100 described herein. The processing chamber 200 also comprises a substrate support 222 spaced a distance from a front plate 138 of the showerhead 130.

In one or more embodiments, as illustrated in FIG. 2, the processing chamber 200 is controlled by a controller 290. In an exemplary embodiment, the controller 290 includes a hard disk drive, a floppy disk drive, and a processor. The processor contains a single-board computer (SBC), analog and digital input/output boards, interface boards, and stepper motor controller boards. Various parts of the processing chamber 200 conform to the Versa Modular European (VME) standard which defines board, card cage, and connector dimensions and types. The VME standard also defines the bus structure as having a 16-bit data bus and a 24-bit address bus.

The controller 290 controls all of the activities of the processing chamber 200. The controller executes system control software, which is a computer program stored in a computer-readable medium. The medium may be a hard disk drive, or other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

The controller 290 includes a central processing unit (CPU) 292, a memory 294, one or more support circuits 296 utilized to control the process sequence and regulate the gas flows, and an input/output (I/O) 298. The CPU 292 may be of any form of a general-purpose computer processor that may be used in an industrial setting. The software routines can be stored in the memory 294, such as random access memory, read only memory, floppy, or hard disk drive, or other form of digital storage. The support circuit 296 is conventionally coupled to the CPU 292 and may include cache, clock circuits, input/output systems, power supplies, and the like.

The memory 294 can include one or more of transitory memory (e.g., random access memory) and non-transitory memory (e.g., storage). The memory 294, or computer-readable medium, of the processor may be one or more of readily available memory such as random access memory (RAM), read-only memory (ROM), floppy disk, hard disk, or any other form of digital storage, local or remote. The memory 294 can retain an instruction set that is operable by the processor to control parameters and components of the system.

Processes may generally be stored in the memory 294 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller 290) that controls the chamber operation such that the processes are performed.

The controller 290 of some embodiments is configured to interact with hardware to perform the programmed function. For example, the controller 290 can be configured to control one or more valves, motors, actuators, power supplies, etc.

In some embodiments, a controller 290 is coupled to the chamber apparatus 221. The controller has one or more configurations to control the various functions and processes. In some embodiments, the configurations are selected from a first configuration to rotate the substrate support about a central axis, a second configuration to provide a flow of gas into a non-plasma processing region, a third configuration to provide a flow of gas into a plasma processing region, a fourth configuration to provide power to the plasma processing region to ignite a plasma and/or a fifth configuration to pulse the power to the plasma processing region to generate an ON time and an OFF time for the plasma processing region.

One or more embodiments of the disclosure are directed to a method of depositing a film on a substrate. In one or more embodiments, the method comprises flowing one or more of a precursor, an oxidant, or a reductant through a showerhead, the showerhead having a front plate and a back plate spaced to form a gas volume, the front plate having an inner surface adjacent the gas volume and an outer surface with a plurality of apertures extending therethrough, the gas volume having a center region and an outer region, an inlet in fluid communication with the center region of the gas volume, the inlet having an inside and an outside; and a mixer disposed on the inside of the inlet to increase gas flow temperature. A flow is then delivered from the front plate of the showerhead to a substrate, and a film is formed on the substrate. In some embodiments, the mixer increases a temperature of the flow without affecting the amount of time it takes to deliver the flow.

According to one or more embodiments, the substrate is subjected to processing prior to and/or after forming a layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A gas distribution apparatus comprising:
a mixing plate adjacent a back plate of a showerhead, the mixing plate having a back surface and a front surface defining a thickness of the mixing plate, the mixing plate having a mixing channel comprising a top portion and a bottom portion defining a mixing channel length, the top portion having a first inner diameter and the bottom portion having a second inner diameter not equal to the first inner diameter, the mixing plate including at least two gas inlets in fluid communication with the top portion of the mixing channel; and
a mixer disposed within the thickness of the mixing plate in the top portion of the mixing channel, the mixer having a top plate and a mixer stem extending from the top plate, the mixer stem comprising a top and a bottom defining a mixer stem length, the top of the mixer stem connected to the top plate and extending into the top portion of the mixing channel, the mixer including a plurality of blades positioned along the mixer stem length, and the top plate including at least one top inlet extending through the thickness of the top plate into the mixing channel.

2. The gas distribution apparatus of claim 1, wherein there are two gas inlets disposed on the same side of the mixing channel relative to a central axis of the mixing channel.

3. The gas distribution apparatus of claim 1, wherein there are two gas inlets arranged at equally spaced angles relative to a central axis of the mixing channel.

4. The gas distribution apparatus of claim 1, wherein there are three inlets arranged at equally spaced angles relative to a central axis of the mixing channel to create a swirling flow pattern.

5. The gas distribution apparatus of claim 1, wherein each of the at least two gas inlets is configured to flow a different gas.

6. The gas distribution apparatus of claim 1, wherein at least one of the two gas inlets is radially aligned with the top portion of the mixing channel.

7. The gas distribution apparatus of claim 6, wherein there are three gas inlets and each of the three gas inlets include three inlets that are radially aligned with the top portion of the mixing channel.

8. The gas distribution apparatus of claim 1, wherein the first inner diameter is at least 1.5 times greater than the second inner diameter.

9. The gas distribution apparatus of claim 8, wherein the first inner diameter is 2 times greater than the second inner diameter.

10. The gas distribution apparatus of claim 9, wherein the first inner diameter is in a range of from 20 mm to 40 mm and the second inner diameter is in a range of from 10 mm to 25 mm.

11. The gas distribution apparatus of claim 1, wherein there is in a range of from 3 to 6 blades arranged at equally spaced distances along the mixer stem length.

12. The gas distribution apparatus of claim 1, wherein a front plate and the back plate of the showerhead are spaced to form a gas volume.

13. The gas distribution apparatus of claim 12, wherein the front plate has an inner surface adjacent the gas volume and an outer surface with a plurality of apertures extending therethrough.

14. The gas distribution apparatus of claim 13, wherein the gas volume has a center region and an outer region defining a length of the gas volume.

15. A processing chamber comprising:

a chamber body having a top wall, bottom wall and at least one sidewall defining a processing volume;

a mixing plate adjacent a back plate of a showerhead, the mixing plate having a back surface and a front surface defining a thickness of the mixing plate, the mixing plate having a mixing channel comprising a top portion and a bottom portion defining a mixing channel length, the top portion having a first inner diameter and the bottom portion having a second inner diameter not equal to the first inner diameter, the mixing plate including at least two gas inlets in fluid communication with the top portion of the mixing channel, a mixer disposed within the thickness of the mixing plate in the top portion of the mixing channel, the mixer having a top plate and a mixer stem extending from the top plate, the mixer stem comprising a top and a bottom defining a mixer stem length, the top of the mixer stem connected to the top plate and extending into the top portion of the mixing channel, the mixer including a plurality of blades positioned along the mixer stem length and the top plate including at least one top inlet extending through the thickness of the top plate into the mixing channel; and a substrate support spaced a distance from a front plate of the showerhead.

16. The processing chamber of claim 15, wherein there are two gas inlets disposed on the same side of the mixing channel relative to a central axis of the mixing channel or at equally spaced angles relative to the central axis of the mixing channel.

17. The processing chamber of claim 15, wherein there are three inlets arranged at equally spaced angles relative to a central axis of the mixing channel to create a swirling flow pattern.

18. The processing chamber of claim 15, wherein at least one of the two gas inlets is radially aligned with the top portion of the mixing channel.

19. The processing chamber of claim 15, wherein the front plate and the back plate of the showerhead are spaced to form a gas volume, the front plate has an inner surface adjacent the gas volume and an outer surface has a plurality of apertures extending therethrough, and the gas volume has a center region and an outer region defining a length of the gas volume.

* * * * *